United States Patent
Bien et al.

(10) Patent No.: US 8,096,179 B2
(45) Date of Patent: Jan. 17, 2012

(54) SENSOR DEVICE WITH REDUCED PARASITIC-INDUCED ERROR

(75) Inventors: David E. Bien, Glendale, AZ (US); Dejan Mijuskovic, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 476 days.

(21) Appl. No.: 12/421,513

(22) Filed: Apr. 9, 2009

(65) Prior Publication Data

US 2010/0259318 A1 Oct. 14, 2010

(51) Int. Cl.
*G01C 19/00* (2006.01)
(52) U.S. Cl. ............... 73/504.02; 73/504.04; 73/504.12
(58) Field of Classification Search ............. 73/504.02, 73/504.04, 504.12; 327/337, 551, 554
See application file for complete search history.

(56) References Cited

U.S. PATENT DOCUMENTS

| | | | |
|---|---|---|---|
| 5,175,518 A | 12/1992 | Swanson, Jr. | |
| 6,549,764 B2 | 4/2003 | Welland | |
| 6,668,614 B2 * | 12/2003 | Itakura | 73/1.38 |
| 6,715,353 B2 | 4/2004 | Johnson | |
| 7,116,159 B2 | 10/2006 | Fleischhacker et al. | |
| 7,240,533 B2 | 7/2007 | Fell et al. | |
| 7,405,099 B2 | 7/2008 | Gogoi | |
| 7,434,464 B2 | 10/2008 | Li | |
| 7,520,170 B2 * | 4/2009 | Murayama | 73/510 |
| 7,663,432 B2 * | 2/2010 | Prandi et al. | 329/347 |
| 7,784,344 B2 * | 8/2010 | Pavelescu et al. | 73/514.32 |
| 7,805,994 B2 * | 10/2010 | Zhang et al. | 73/504.12 |
| 7,825,715 B1 * | 11/2010 | Greenberg | 327/337 |
| 7,827,864 B2 * | 11/2010 | Prandi et al. | 73/504.18 |
| 7,986,182 B2 * | 7/2011 | Prandi et al. | 329/347 |
| 2003/0209789 A1 | 11/2003 | Hanson et al. | |
| 2007/0164378 A1 | 7/2007 | MacGugan | |
| 2008/0295596 A1 | 12/2008 | Zhang et al. | |

FOREIGN PATENT DOCUMENTS

JP 2001099658 4/2001

OTHER PUBLICATIONS

PCT Application No. PCT/US2010/028282; Search Report and Written Opinion dated Oct. 14, 2010.

* cited by examiner

*Primary Examiner* — Freddie Kirkland, III
(74) *Attorney, Agent, or Firm* — Meschkow & Gresham, P.L.C.

(57) ABSTRACT

A device (110) includes a sensing element (26) having drive nodes (34, 36) and sense nodes (42, 44). Parasitic capacitance (22) is present between drive node (34) and sense node (42). Likewise, parasitic capacitance (24) is present between drive node (36) and sense node (44). When a drive signal (56) is applied between drive nodes (34, 36), a parasitic current (70) between drive and sense nodes (34, 42) and a parasitic current (72) between drive and sense nodes (36,44) is created due to the parasitic capacitances (22, 24). A capacitive network (112) is coupled between the drive node (36) and the sense node (42) to create a correction current (134) through capacitive network (112) that cancels parasitic current (70). Likewise, a capacitive network (114) is coupled between the drive node (34) and the sense node (44) to create a correction current (138) through capacitive network (112) that cancels parasitic current (72).

20 Claims, 6 Drawing Sheets

$$\frac{I_{eff}}{V_D} = j2\pi f C_{eff} \quad \leftarrow 198$$

$$C_{EFF} = \frac{C1(C3)(C5)}{C1(C3) + C3(C5) + C1(C5) + C2(C3 + C5) + C4(C1+C3) + C2(C4)} \quad \leftarrow 200$$

WHERE:
 j = IMAGINARY UNIT ($j^2 = -1$)
 f = FREQUENCY OF $V_D$ (Hz)
 C4 = CN4 + $C_{SW}$
 C2 = CAPACITANCE SEEN AT DIODE (DN2)

| CAPACITOR VALUES WITH RESULTING EFFECTIVE NETWORK CAPACITANCES (IN FEMPTOFARADS) | | | | | | | | | | |
|---|---|---|---|---|---|---|---|---|---|---|
| C1 | C3 | C5 | C2 | C4 | $C_{EFF}$ ON | $C_{EFF}$ OFF | C11 ON | C11 OFF | C22 ON | C22 OFF |
| 18.3 | 18.3 | 18.3 | 6.5 | 681 | 0.2 | 0 | 17.8 | 18.3 | 10.4 | 10.5 |
| 20.1 | 18.3 | 18.3 | 6.5 | 346 | 0.4 | 0 | 17.4 | 18.3 | 10.9 | 11.1 |
| 24.7 | 24.7 | 24.7 | 6.5 | 299 | 0.8 | 0 | 22.9 | 24.7 | 13.4 | 13.8 |
| 26.7 | 26.7 | 26.7 | 6.5 | 117 | 1.6 | 0 | 23.1 | 26.7 | 14.1 | 14.8 |
| 31.9 | 31.9 | 31.9 | 6.5 | 95 | 3.2 | 0 | 24.8 | 31.9 | 16 | 17.4 |
| 43.7 | 43.7 | 43.7 | 6.5 | 71 | 6.4 | 0 | 29.9 | 43.7 | 20.4 | 23.4 |
| 77.4 | 77.4 | 77.4 | 6.5 | 107 | 12.8 | 0 | 50.7 | 77.4 | 34.1 | 40.3 |
| 122 | 122 | 122 | 6.5 | 99 | 25.6 | 0 | 69.5 | 122 | 50.1 | 62.6 |

SENSOR DEVICE WITH REDUCED PARASITIC-INDUCED ERROR

TECHNICAL FIELD OF THE INVENTION

The present invention relates generally to sensors. More specifically, the present invention relates to a sensor device with reduced parasitic-induced error.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. The electromechanical portion of the device provides the sensing capability, while the electronic portion processes the information obtained by the electromechanical portion. One example of a MEMS sensor is a MEMS gyroscope sensor.

Alternatively referred to as a "gyroscope", "gyrometer," "angular rate sensor," or "yaw rate sensor," a gyroscope sensor senses angular speed around one or more axes. One type of MEMS gyroscope sensor uses a vibrating element to sense angular rate through the detection of a Coriolis force, or acceleration. The vibrating element is put into oscillatory motion in the X-axis (drive plane), which is parallel to the substrate. Once the vibrating element is put in motion, it is capable of detecting angular rates induced by the substrate being rotated about the Z-axis. The Coriolis acceleration occurs in the Y-axis (sense plane), which is perpendicular to both the X-axis and the Z-axis. The Coriolis acceleration produces a motion having an amplitude that is proportional to the angular rotation rate of the substrate.

In electrical circuits, parasitic capacitance is the unavoidable and typically unwanted capacitance that exists between the parts of an electronic component or circuit due, in part, to their proximity to one another. In addition, all actual circuit elements such as, inductors, diodes, and transistors have internal parasitic capacitance, which can cause their behavior to depart from that of "ideal" circuit elements. Parasitic capacitance can also exist between closely spaced conductors, such as wires or printed circuit board traces. The parasitic capacitance may be inherent in a MEMS sensor or the associated packaging and bonding arrangement, so that the parasitic capacitance values could change not only for different sensor implementations, but the parasitic capacitance values could vary from unit-to-unit in production.

A MEMS gyroscope sensor has parasitic capacitance between the drive nodes and the sense nodes of the device which produces an error in the signals corresponding to sensor position. Parasitic capacitances between the drive nodes and the sense nodes are particularly troublesome, since the parasitic capacitances produce currents that are in quadrature with the desired sensor position signal. Thus, an error is created in the signal determined at the sense nodes so that the position of the vibrating element is determined in error.

Some approaches involve combining capacitors directly in parallel through a switch in series with each capacitor to create a one-port capacitive network with variable capacitance. Unfortunately, because of the parasitic capacitance inherent in the switches, as well as the minimum physical size of the capacitors for a MEMS sensor implementation, the minimum capacitance of the switched elements cannot reach zero. Moreover, in such a one-port capacitive network, the minimum achievable capacitance can increase as the number of switched capacitors increases. Limitations in the minimum physical size of the capacitors and an increase in the minimum achievable capacitance as the number of switched elements increases are highly undesirable in some MEMS gyroscope sensors where parasitic capacitance values can be in a range of approximately one half to fifty femtofarads.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 9 shows a table of exemplary capacitor values for the multiple capacitors within the capacitive circuits and the resulting effective network capacitances.

DETAILED DESCRIPTION

Embodiments of the invention entail a microelectromechanical (MEMS) sensor with reduced parasitic-induced error and methodology for reducing parasitic-induced error in a MEMS sensor. Two-port capacitive networks are implemented in the MEMS sensor that allow for adjustment of an effective capacitance in order to create opposing currents of the proper phase to cancel parasitic-induced error currents. The two-port capacitive networks are adjustable over a wide range of capacitances and allow the effective capacitances to be made as small as needed (e.g., below the smallest on-chip components or parasitic capacitances).

The MEMS sensor discussed below is an inertial sensor having the appropriate circuitry and structure to form a MEMS gyroscope sensor with reduced parasitic-induced error. However, the principles discussed below that yield reduced parasitic-induced error may alternatively be applied to other types of devices, such as MEMS accelerometers, MEMS pressure sensors, and the like. Furthermore, the principles can be applied to non-MEMS devices or general integrated circuits. Accordingly, discussion of specific types of inertial sensors, such as a MEMS gyroscope, is exemplary and not intended to limit the scope of various embodiments.

Figure 1:
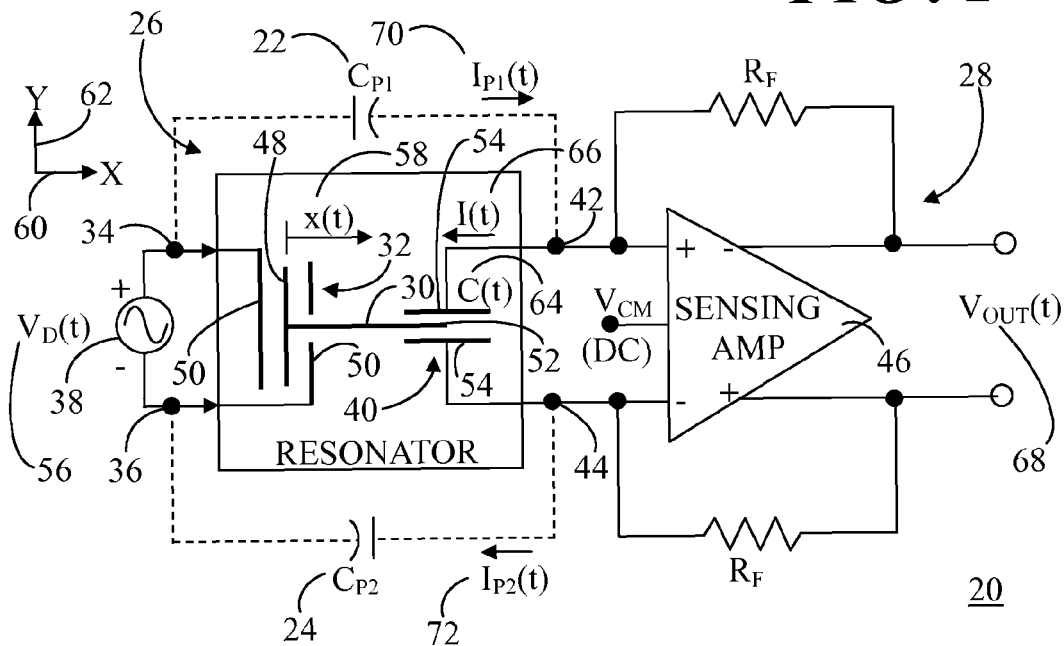
FIG. 1 shows a schematic diagram of a microelectromechanical systems (MEMS) sensor exemplifying the presence of parasitic capacitances.

FIG. 1 shows a schematic diagram of a microelectromechanical systems (MEMS) gyroscope sensor 20 exemplifying the presence of parasitic capacitances 22 and 24. In general, MEMS sensor 20 includes a sensor element, such as a resonator element 26, and a sensing circuit 28. Resonator element 26 includes one or more movable elements, typically referred to as proof masses. These movable elements are coupled to an underlying substrate (not shown) by various mechanical linkages and springs that enable their movement. Various embodiments may include one or more movable elements that may be configured, for example, as drive masses or as sense masses. For simplicity, the one or more movable elements are represented by a single structural element, i.e., a single proof mass 30.

Resonator element 26 includes a drive structure 32 electrically coupled with a pair of drive nodes 34, 36. An alternating current (AC) voltage source 38 is coupled between drive nodes 34 and 36. Resonator element 26 further includes a sense structure 40 electrically coupled with a pair of sense nodes 42 and 44. Sense nodes 42 and 44 are in electrical communication with a sensing amplifier 46 of sensing circuit 28.

Drive structure 32 includes moving drive fingers 48 (of which one is shown) extending from proof mass 30 and fixed drive fingers 50 (of which two are shown) which are anchored to an underlying substrate (not shown) so that fixed drive fingers 50 are non-movable relative to moving drive fingers 48. In addition, moving drive fingers 48 are configured to interleave with pairs of fixed drive fingers 50.

Sense structure 40 includes moving sense fingers 52 (of which one is shown) extending from proof mass 30 and fixed sense fingers 54 (of which two are shown) which are anchored to the underlying substrate (not shown) so that fixed sense fingers 54 are non-movable relative to moving sense fingers 52. In addition, moving sense fingers 52 are configured to interleave with pairs of fixed sense fingers 54.

It should be noted that the configuration of proof mass 30, drive structure 32, and sense structure 40 are provided for illustrative purposes. The size, shape, quantity, and material of proof mass 30, components of drive structure 32, components of sense structure 40, and the like may be selected in accordance with known mechanical design principles to achieve the desired sensitivity, stability, and range of MEMS sensor 20. Likewise, the shape, size, material, and spring constants of the mechanical linkage and springs (not shown) suspending proof mass 30 may be selected to achieve the desired movement of proof mass 30.

In an embodiment, MEMS sensor 20 is implemented as a capacitance type gyroscope. That is, a drive signal, e.g., a sinusoidal drive voltage 56, from voltage source 38 is applied between fixed drive fingers 50 due to their electrical connection with drive nodes 34, 36, to cause oscillatory linear motion 58, labeled x(t), of proof mass 30. When MEMS sensor 20 experiences a change in angular velocity and is in oscillatory linear motion 58, proof mass 30 will move. That is, rotation of MEMS sensor 20 imparts a Coriolis force, also referred to as a Coriolis acceleration, to proof mass 30 that is proportional to the angular velocity, and depends on the orientation of the angular velocity vector with respect to the velocity vector of proof mass 30. The Coriolis acceleration, the angular velocity vector, and the mass velocity vector are mutually orthogonal. For example, the resulting Coriolis acceleration due to the interaction of oscillatory linear motion 58 applied along the drive axis, i.e. an X-axis 60, and the input angular velocity about, for example, the Z-axis extending out of the page, is transmitted along proof mass 30 to moving sense fingers 52.

Together, fixed sense fingers 54 and adjacent moving sense fingers 52 form a variable differential capacitor. As such, when MEMS sensor 20 experiences an angular rate change about the Z-axis, each moving sense finger 52 will move along the sense axis, i.e., a Y-axis 62, toward one of the adjacent fixed sense fingers 54 and away from another of the adjacent fixed sense fingers 54. The distance that the moving sense finger 52 moves will result in a proportional change in a capacitance 64, labeled C(t), between the fixed sense fingers 52 and the moving sense fingers 54. The change in capacitance 64 creates a sense current 66, labeled I(t). Sense current 66 is output via sense nodes 42 and 44 to sensing amplifier 46 where it may be amplified and converted to an output voltage 68, labeled $V_{OUT}(t)$, proportional to the angular velocity.

Parasitic capacitance 22, labeled $C_{P1}$, is present between drive node 34 and sense node 42, each of which are of the same polarity when drive voltage 56 is applied between drive nodes 34 and 36. Parasitic capacitance 22 creates a parasitic current 70, labeled $I_{P1}(t)$, between drive node 34 and sense node 42. Likewise, parasitic capacitance 24, labeled $C_{P1}$, is present between drive node 36 and sense node 44, each of which are of the same polarity, when drive voltage 56 is applied between drive nodes 34 and 36. Parasitic capacitance 24 creates a parasitic current 72, labeled $I_{P2}(t)$, between drive node 36 and sense node 44. In order to differentiate the various nodes for clarity, drive node 34 is referred to hereinafter as first drive node 34 and sense node 42 is referred to hereinafter as first sense node 42 to denote their matching polarity. Likewise, drive node 36 is referred to hereinafter as second drive node 36 and sense node 44 is referred to hereinafter as second sense node 44 to denote their matching polarity. Parasitic capacitances 22 and 24 are not physical components within MEMS sensor 20. Accordingly, their interconnection with drive nodes 34 and 36 and corresponding sense nodes 42 and 44 are represented by dashed lines.

Parasitic currents 70 and 72 combine with sense current 66 and are thus output via first and second sense nodes 42 and 44 to sensing amplifier 46. Parasitic currents 70 and 72 may then be amplified with the desired signal, i.e., sense current 66, and converted to output voltage 68 at sensing amplifier 46. Consequently, the resulting output voltage 68 has a parasitic-induced error that adversely affects the sensed angular velocity.

Figure 2:
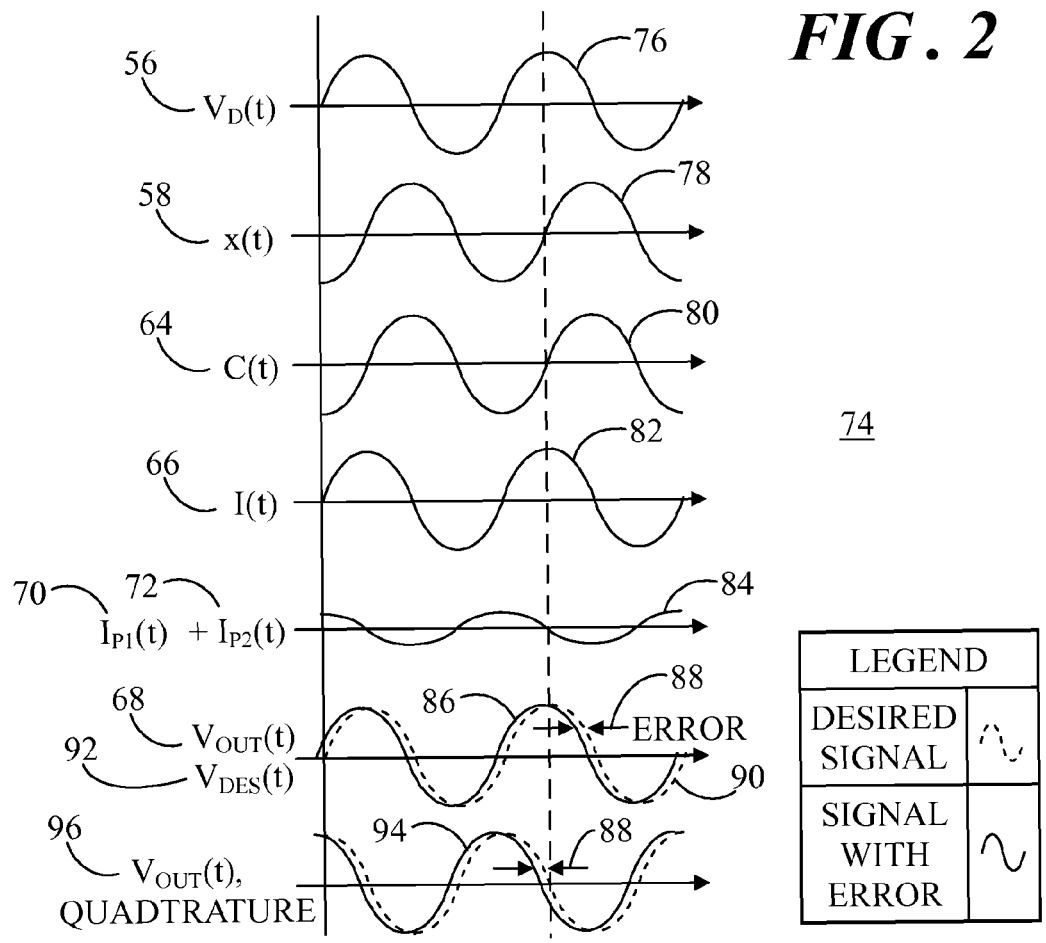
FIG. 2 shows a chart of waveforms exemplifying parasitic-induced error introduced into the MEMS sensor of FIG. 1 due to the parasitic capacitances.

Referring to FIG. 2 in connection with FIG. 1, FIG. 2 shows a chart 74 of waveforms exemplifying parasitic-induced error introduced into the MEMS gyro sensor 20 (FIG. 1) due to parasitic capacitances 22 and 24. Chart 74 includes a waveform 76 representing AC drive voltage 56 from voltage source 38 applied at drive nodes 34 and 36. Another waveform 78 represents the position, or oscillation, of moving sense fingers 48 extending from proof mass 30 in response to drive voltage 56. The next waveform 80 represents time varying capacitance 64 between moving sense fingers 52 and fixed sense fingers 54. Note that waveform 80, representing the time varying capacitance 64, is in phase with waveform 78, representing the position of moving sense fingers 48.

A next waveform 82 represents sense current 66 related to time varying capacitance 64. Note that waveform 82, representing the changing sense current 66, is in phase with waveform 76, representing drive voltage 56. A next waveform 84 represents the combined parasitic currents 70 and 72 resulting from the corresponding parasitic capacitances 22 and 24. Waveform 84, representing the combined parasitic currents 70 and 72, is out of phase with waveform 80 representing sense current 66. Accordingly, a next waveform 86 (solid line) represents output voltage 68 adversely affected by a parasitic-induced error 88. Another waveform 90 (dashed line) overlies waveform 86 and represents a desired output voltage 92, labeled $V_{DES}(t)$, without parasitic-induced error 88.

Thus, time varying parasitic capacitances 22 and 24 produce parasitic-induced error 88 in output voltage 68 corresponding to the position of proof mass 30, and consequently to the angular velocity. Parasitic capacitance 22 between first drive node 34 and first sense node 42 and parasitic capacitance 24 between second drive node 36 and second sense node 44 cause a phase error at output voltage 68 because the parasitic current contribution, i.e. parasitic currents 70 and 72, is out of phase with sense current 66. Of course, this phase error adversely affects the accuracy of MEMS sensor 20. In addition, parasitic capacitances 22 and 24 produce currents that are in quadrature with desired output voltage 92. Thus, a waveform 94 represents a quadrature signal 96 determined at sense nodes 42 and 44 in which parasitic-induced error 88 is also present in quadrature signal 96.

An embodiment of the invention entails the implementation of two-port capacitive networks that largely cancel parasitic currents 70 and 72 thereby substantially reducing parasitic-induced error 88 on the output voltage 68 and commensurately on quadrature signal 96.

Figure 3:
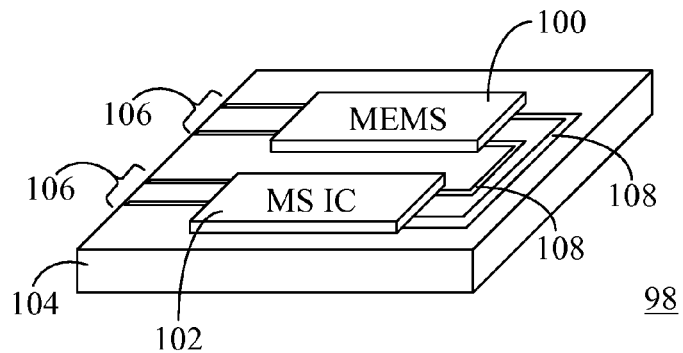
FIG. 3 shows a perspective view of an exemplary MEMS sensor.

FIG. 3 shows a perspective view of an exemplary MEMS device 98. MEMS device 98 generally includes an electromechanical portion 100 which provides the sensing capability and an electronic portion 102, in the form of a mixed signal integrated circuit (MS IC), which processes the information obtained by electromechanical portion 100. Both electromechanical portion 100 and electronic portion 102 may be formed on a single substrate 104 with appropriate input and output traces 106 and with appropriate interconnecting traces 108.

In an embodiment, resonator element 26 (FIG. 1) may be implemented in electromechanical portion 100. Sensing circuit 28 (FIG. 1), capacitive networks (discussed below), and/or other circuitry may be implemented in electronic portion 102. Such a MEMS device 98 may be used to perform various monitoring and/or control functions in, for example, airbag deployment systems, automatic yaw control devices, safety mechanisms, cellular phones, laptop and notebook computers, cameras, game controllers, and the like where sensor accuracy combined with a miniaturized form factor are required. It should be noted that MEMS device 98 is provided for illustrative purposes. Those skilled in the art will recognize that MEMS device 98 can have various configurations, can have more or less components, and so forth.

Figure 4:
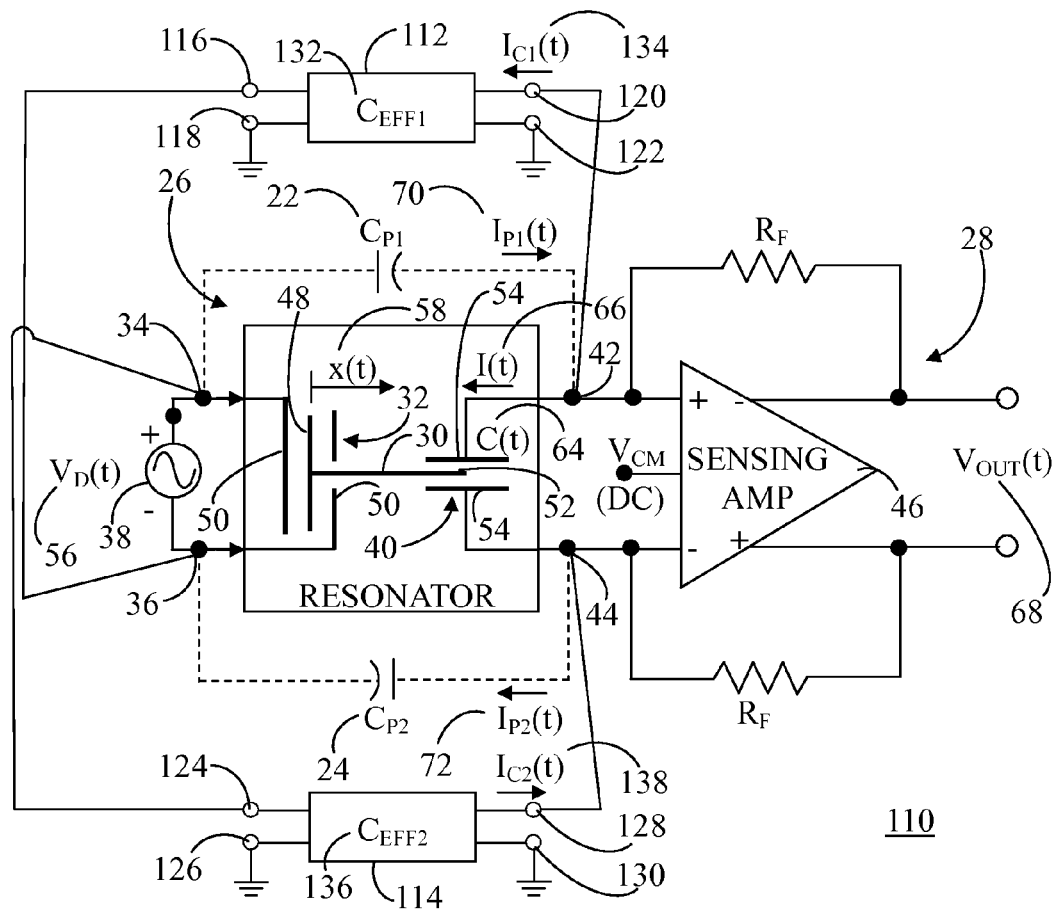
FIG. 4 shows a schematic diagram of the MEMS sensor of FIG. 3 having two-port capacitive networks implemented therein for reducing parasitic-induced error in accordance with an embodiment of the invention.

FIG. 4 shows a schematic diagram of a MEMS sensor 110 having two-port capacitive networks 112 and 114 implemented therein for reducing parasitic-induced error 88 (FIG. 2) in accordance with an embodiment of the invention. In practice, MEMS sensor 110 may be generally configured to form MEMS device 98 (FIG. 3). For simplicity, two-port capacitive networks 112 and 114 are discussed in connection with their integration into a MEMS sensor configuration such as that described in connection with FIG. 1. As such, the reference numerals utilized in FIG. 1 are also utilized in FIG. 4 when referencing the same components. However, as mentioned above, the specific MEMS sensor can take various structural forms in alternative embodiments.

Consequently, MEMS sensor 110 includes resonator element 26 having drive structure 32 electrically coupled with first and second drive nodes 34 and 36, respectively, and sense structure 40 electrically coupled with first and second sense nodes 42 and 44, respectively. As discussed in detail above, parasitic capacitance 22 is present between first drive node 34 and first sense node 42 which creates the phase shifted parasitic current 70 between first drive node 34 and first sense node 42. Likewise, parasitic capacitance 24 is present between second drive node 36 and second sense node 44 which creates the phase shifted parasitic current 72 between second drive node 36 and second sense node 44. Although discussed in connection with MEMS sensor 110, capacitive networks 112 and 114 may alternatively be applied to other types of MEMS devices, non-MEMS devices, and/or general integrated circuits where a reduction of parasitic-induced error 88 (FIG. 2) is required.

In accordance with an embodiment, capacitive network 112 has an input 116 coupled to second drive node 36 and another input 118 coupled to ground. In addition, capacitive network 112 has an output 120 coupled to first sense node 42 and another output 122 coupled to ground. Similarly, capacitive network 114 has an input 124 coupled to first drive node 34 and another input 126 coupled to ground. Additionally, capacitive network 114 has an output 128 coupled to second sense node 44 and another output 130 coupled to ground.

In general, a two-port network is an electrical circuit with two pairs of terminals (i.e., the circuit connects two dipoles). The two terminals constitute a port if they satisfy a requirement known as a port condition, i.e., the same current must enter and leave a port. As will be discussed in greater detail below, capacitive network 112 produces an effective capacitance 132, labeled $C_{EFF1}$, that is substantially equivalent to parasitic capacitance 22. Accordingly, when drive voltage 56 is applied at input 116, a correction current 134, labeled $I_{C1}(t)$ is formed through capacitive network 112 that is substantially equivalent to and out of phase with parasitic current 70. Thus, correction current 134 at sense node 42 cancels parasitic current 70 at sense node 42.

Likewise, capacitive network 114 produces an effective capacitance 136, labeled $C_{EFF2}$, that is substantially equivalent to parasitic capacitance 24. Accordingly, when drive voltage 56 is applied at input 124, a correction current 138, labeled $I_{C2}(t)$ is formed through capacitive network 114 that is substantially equivalent to and out of phase with parasitic current 72. Thus, correction current 138 at sense node 44 cancels parasitic current 72 at sense node 44.

In an embodiment, each of capacitive networks 112 and 114 are digitally adjustable over a significant range, for example, over a range of approximately 0.2-50 femtofarads. Such an adjustment range is advantageous in MEMS sensor 110 where each of parasitic capacitances 22 and 24 are likely to be present in the range of 0.5-50 femtofarads. Parasitic capacitances 22 and 24 need not be identical. Accordingly, capacitive networks 112 and 114 are independently adjustable so that they may be individually adjusted, or tuned, to obtain appropriate values of effective capacitances 132 and 136.

Figure 5:
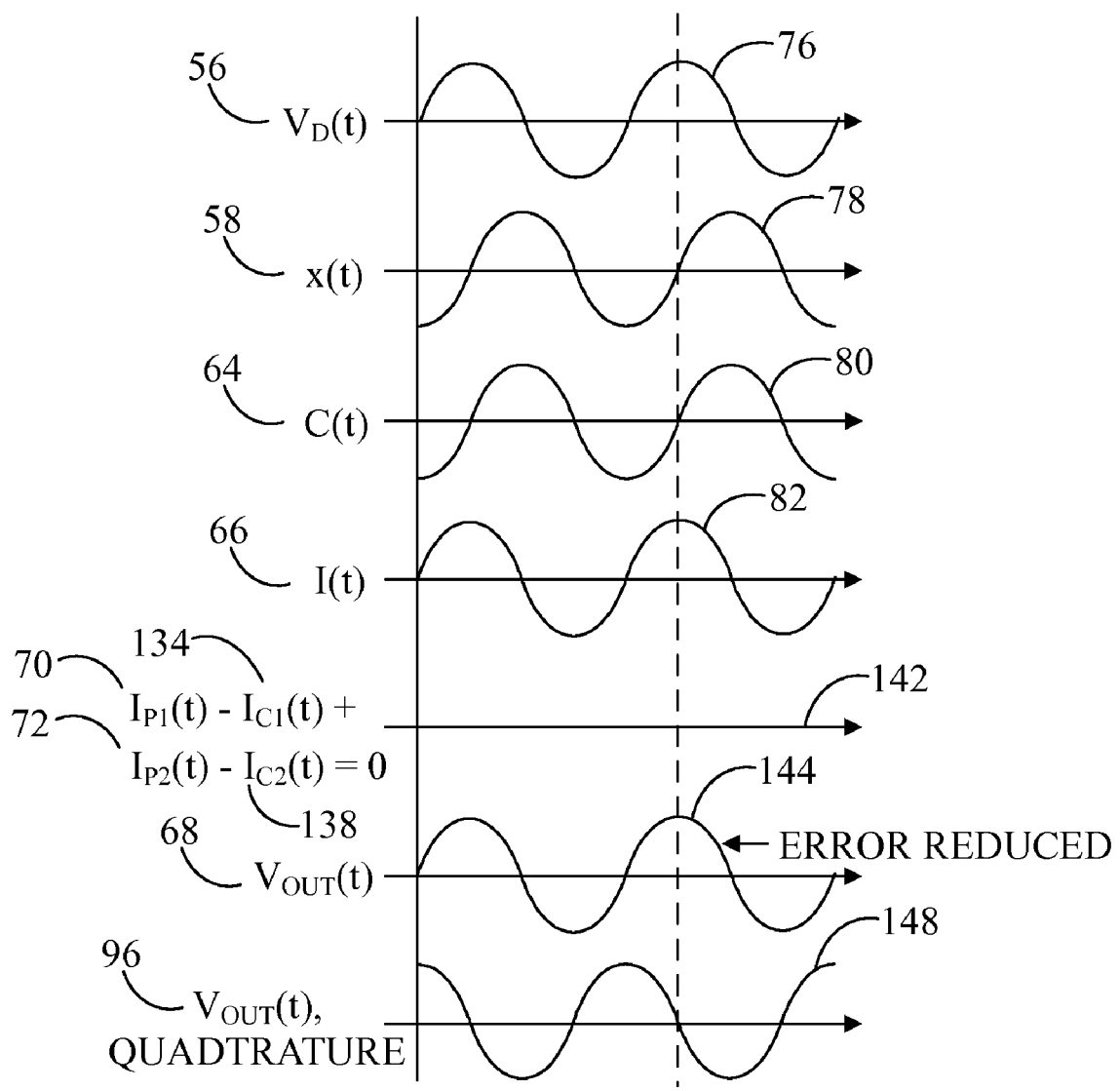
FIG. 5 shows a chart of waveforms of exemplifying a reduction in error as a result of implementation of the two-port capacitive networks in a MEMS sensor.

Referring to FIG. 5 in connection with FIG. 4, FIG. 5 shows a chart 140 of waveforms exemplifying a reduction in parasitic-induced error 88 (FIG. 2) as a result of implementation of capacitive networks 112 and 114 in MEMS sensor 110. Like chart 74 (FIG. 2), chart 140 includes waveform 76 representing AC drive voltage 56 from voltage source 38 applied at drive nodes 34 and 36, and waveform 78 representing oscillatory linear motion 58 of moving sense fingers 48 extending from proof mass 30 in response to drive voltage 56. In addition, chart 140 includes waveform 80 representing time varying capacitance 64 between moving sense fingers 52 and fixed sense fingers 54 and waveform 82, representing the changing sense current 66.

Chart 140 further includes a waveform 142 that represents parasitic currents 70 and 72 being substantially canceled by corresponding correction currents 134 and 138. Accordingly, waveform 142 illustrates the total current resulting from parasitic currents 70 and 72 and corresponding correction currents 134 and 138 is substantially zero. Accordingly, a next waveform 144 represents output voltage 68 with parasitic-induced error 88 (FIG. 2) greatly reduced. Likewise, another waveform 148 represents quadrature signal 96 determined at sense nodes 42 and 44 in which parasitic-induced error 88 is greatly reduced. That is, the phase shift from the desired signal, as shown in FIG. 2, is largely absent in each of waveforms 144 and 148. Consequently, capacitive networks 112 and 114 implemented in MEMS sensor 110 largely cancel parasitic currents 70 and 72 thereby substantially reducing parasitic-induced error 88 on output voltage 68 and commensurately on quadrature signal 96.

Figure 6:
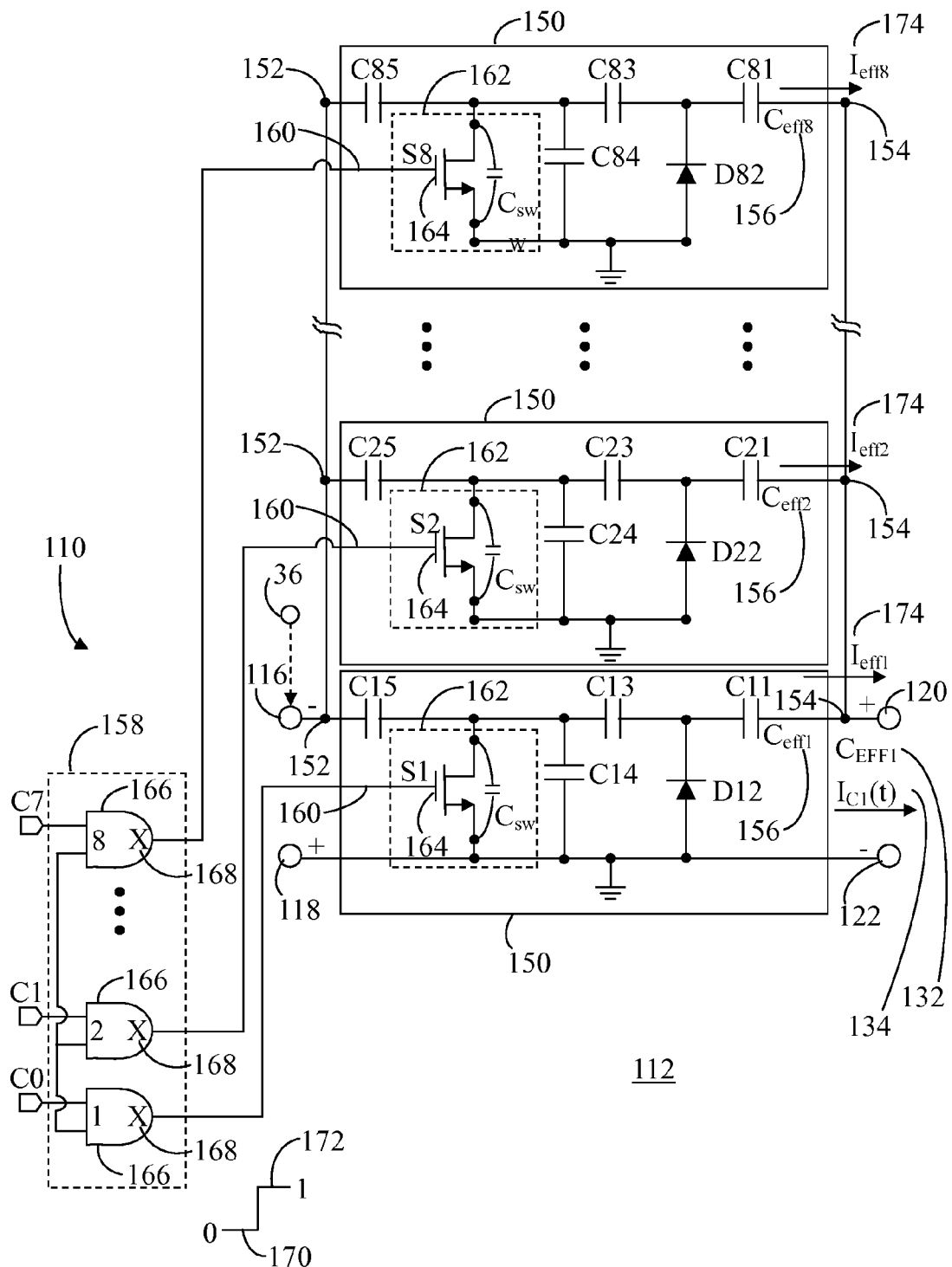
FIG. 6 shows a two-port capacitive network in accordance with another embodiment of the invention.

FIG. 6 shows schematic diagram of two-port capacitive network 112 in accordance with an embodiment. Capacitive network 112 represents a generalized two-port capacitive network model that, with the appropriate selection of capacitor values and the appropriate selection of capacitor circuits (discussed below), will produce effective capacitance 132 to create correction current 134 that substantially cancels parasitic current 70 (FIG. 4). Although FIG. 6 is discussed in connection with capacitive network 112, it should be understood that the following description applies equivalently to capacitive network 114 (FIG. 4) to yield effective capacitance 136 (FIG. 4) and commensurately correction current 138 (FIG. 4) that substantially cancels parasitic current 72 (FIG. 4).

Capacitive network 112 includes multiple capacitive circuits 150 connected in parallel. Each of capacitive circuits 150 has a corresponding input 152 coupled to input 116 of capacitive network 112 and a corresponding output 154 coupled to output 120 of capacitive network 112. Each of capacitive circuits 150 produces a circuit capacitance 156, labeled $C_{eff1}$, $C_{eff2}$, through $C_{eff8}$. As is well understood in the art, the total capacitance of two or more capacitors connected in parallel, with the same drive voltage applied to each capacitor, will be the sum of the capacitance values of the individual capacitors connected in parallel. Accordingly, effective capacitance 132, i.e., $C_{EFF1}$, is the sum of circuit capacitances 156 (i.e., $C_{eff1}$, $C_{eff2}$, through $C_{eff8}$). The lower case labeling nomenclature of "eff" used in connection with circuit capacitances 156 is used herein to differentiate the individual circuit capacitances 156 from the sum of the capacitances, i.e. effective capacitance 132, labeled $C_{EFF1}$.

In the illustrated embodiment, capacitive network 112 includes eight capacitive circuits 150. Hence, an eight unit labeling nomenclature of individual components within capacitive circuits 150 is shown (for example, Cn1, Dn2, Cn3, Cn4, Cn5, and Sn, where n is a number between 1 and 8). Although capacitive network 112 is described as having eight capacitive circuits 150, it will become apparent that a capacitive network can be adapted to include more or less than eight capacitive circuits depending upon a desired range of values for effective capacitance 132 and/or the resolution of adjustment steps for capacitive network 112. Only three capacitive circuits 150 are shown in FIG. 6 for simplicity of illustration with ellipses being provided to represent the additional five capacitive circuits 150.

In an embodiment, capacitive circuits 150 are individually controlled by a digital control function 158 of MEMS sensor 110. To this end, MEMS sensor 110 includes multiple control circuits 162 (each of which are delineated by a dashed-line box), one each of control circuits 162 being coupled to one each of capacitive circuits 150. Each of control circuits 162 includes a switch element 164, which in some embodiments, may be a metal oxide semiconductor (MOS) transistor. Each switch element 164 is interposed between its corresponding capacitive circuit 150 and ground.

Digital control function 158 includes multiple digital control elements, or logic gates 166. In the illustrated embodiment, digital control function 158 provides eight bits 168 of digital control, with each logic gate 166 providing a single bit 168. Each logic gate 166 includes a gate terminal 160 coupled to one of control circuits 162 that functions as a control input to its corresponding control circuit 162. As such, each logic gate 166 provides one bit 168 of digital control to its associated switch element 164. The individual logic gates 166 are numbered one through eight, with only three logic gates 166 being shown in association with their respective capacitive circuits 150 for simplicity of illustration. Ellipses are provided to represent the additional five logic gates 166.

As is well known in the art, a logic gate performs a logical operation on one or more logic inputs and produces a single logic output, i.e., bit 168, having a first state 170 or a second state 172. By way of example, upon command from digital control function 158, a logic gate 166 may provide bit 168 in first state 170 that effects closure of (i.e., actuates) the associated switch element 164 or in second state 172 that effects opening of (i.e., de-actuates) the associated switch element 164 of the control circuit 162 to which logic gate 166 is coupled.

In an exemplary scenario, when switch element 164 is closed, a shunt to ground is formed. Thus, when switch element 164 is closed for a particular capacitive circuit 150, then no current is present at its output, so circuit capacitance 156 is effectively zero. However, when switch element 164 is open, the shunt to ground is removed, and the particular capacitive circuit 150 provides circuit capacitance 156 and therefore a circuit current 174, labeled $I_{eff1}$, $I_{eff2}$, through $I_{eff8}$, at its output 154. Of course, the sum of the circuit currents 174 yields correction current 134, labeled $I_{C1}(t)$ at first sense node 42. By selectively opening and closing particular switch elements 164 through digital control, the desired effective capacitance 132 is produced to yield a desired correction current 134 at first sense node 42 that substantially cancels parasitic current 70 (FIG. 4). The lower case labeling nomenclature of "eff" used in connection with circuit currents 174 is used herein to correspond with the same nomenclature used for the individual circuit capacitances 156.

Figures 7, 8:
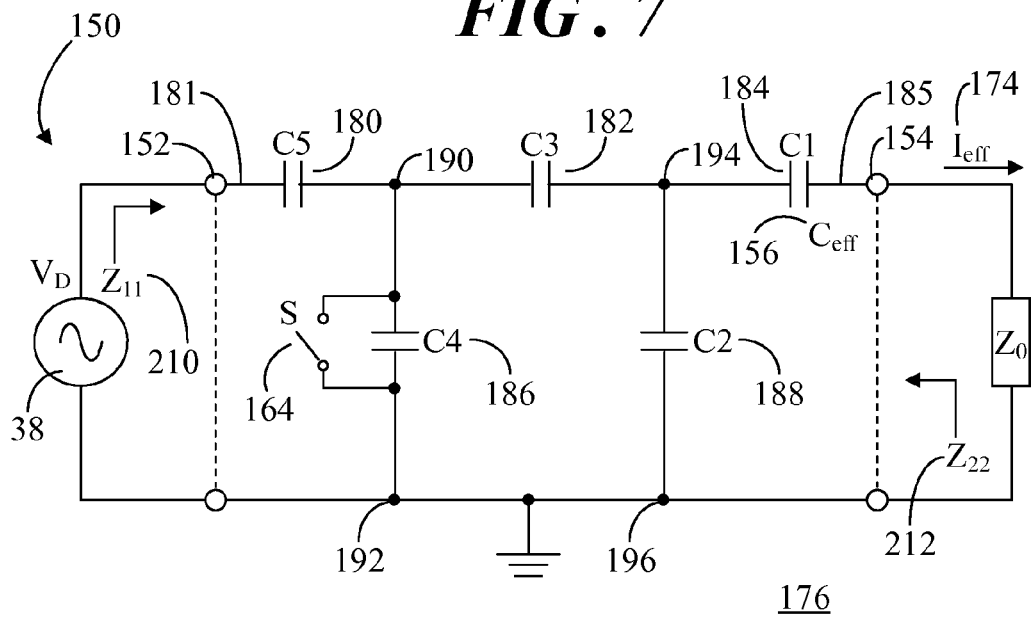
FIG. 7 shows a circuit model of one of multiple capacitive circuits implemented in the two-port capacitive network.
FIG. 8 shows a chart corresponding to the circuit model of FIG. 7 that provides equations for determining an effective capacitance, $C_{eff}$, achievable at each of the capacitive circuits in the two-port capacitive network.

Referring to FIGS. 7 and 8, FIG. 7 shows a circuit model 176 of one of multiple capacitive circuits 150 implemented in either of capacitive networks 112 and 114 (FIG. 6) and FIG. 8 shows a chart 178 corresponding to circuit model 176 that provides equations for determining circuit capacitance 156, $C_{EFF}$, achievable at each of capacitive circuits 150 in capacitive networks 112 and 114 (FIG. 4). Each of capacitive circuits 150 of capacitive networks 112 and 114 is configured as shown in FIG. 7. However, a combination of differing values of capacitance values within a particular capacitive circuit 150 yields a different circuit capacitance 156 at its output 154. Circuit model 176 provides means for determining circuit capacitance 156 for one of capacitive circuits 150.

As mentioned above, parasitic capacitances 22 and 24 (FIG. 1) between drive nodes 34 and 36 and corresponding sense nodes 42 and 44 in a MEMS sensor (e.g., MEMS sensor 20 and MEMS sensor 110) are likely to be present in the range of 0.5 to 50 femtofarads. In order to effectively cancel parasitic currents 70 and 72 (FIG. 1), it is thus essential to produce effective capacitances 132 and 136 (FIG. 4) in respective capacitive networks 112 and 114 that are in the femtofarad range with less than one femtofarad resolution. Furthermore, parasitic capacitances 22 and 24 may be inherent in the MEMS sensor or the associated packaging and bonding arrangement so that parasitic capacitances 22 and 24 may vary, not only for different sensor implementations, but they may vary from unit-to-unit in production. Capacitive networks 112 and 114, each having multiple individually controlled capacitive circuits 150, emulate an extremely small value tunable capacitor using practical on-chip component sizes.

As represented in model 176, capacitive circuit 150 includes a capacitive element 180, labeled C5, a capacitive element 182, labeled C3, and a capacitive element 184, labeled C1 connected in series. Capacitive element 180 has an end 181 coupled to input 152 of capacitive circuit 150 and capacitive element 184 has an end 185 coupled to output 154 of capacitive circuit 150. Capacitive circuit 150 further includes a capacitive element 186, labeled C4, and a capacitive element 188, labeled C2. Capacitive element 186 has an end 190 between capacitive elements 180 and 182 and another end 192 coupled to ground. Similarly, capacitive element 188 has an end 194 between capacitive elements 182 and 184 and another end 196 coupled to ground.

Referring briefly to FIG. 6, capacitive element 180 represents component Cn5 (e.g., C15, C25, through C85) of capacitive circuit 150. Likewise, capacitive element 182 represents component Cn3 (e.g., C13, C23, through C83) of capacitive circuit 150. Capacitive element 184 represents component Cn1 (e.g., C11, C21, through C81) of capacitive circuit 150. Capacitive element 186 represents component Cn4 (e.g., C14, C24, through C84) of capacitive circuit 150 summed with the switch capacitance $C_{sw}$ across the corresponding switch 164. Capacitive element 188 represents component Dn2 (e.g., D12, D22, through D82) of capacitive circuit 150. More particularly, capacitive element 188 represents the capacitance seen at a diode (D12, D22, through D82). Capacitive elements 180, 182, 184, 186, and 188 may be integrated circuit (IC) capacitors, parasitic capacitors, or elements that behave substantially as capacitors, such as reverse-biased diodes or open switches.

With reference back to FIGS. 7 and 8, given that sensing amplifier 46 (FIG. 1) maintains a low impedance at output 154, which is less than the impedance of the combination of capacitive elements 180, 182, 184, 186, and 188, then the relationship between drive voltage 56 at input 152 is determined entirely by the impedance of the combination of capacitive elements 180, 182, 184, 186, and 188. This relationship is represented by an equation 198 in chart 178.

By analyzing circuit model 176 of capacitive circuit 150 and comparing the relationships, it can be shown that the effective capacitance of capacitive circuit 150, i.e., circuit capacitance 156, can be represented by an equation 200 shown in chart 178. Generally, the values of each of capacitive elements 180, 182, 184, 186, and 188 can be selected according to a predetermined required circuit capacitance 156. In addition, switch 164 is configured to that capacitive element 186, labeled C4, is shorted when switch 164 is closed. Accordingly, when switch 164 is closed, an effective capacitance at capacitive element 186 is infinite. In such a scenario, circuit capacitance 154 will be zero. In an alternative embodiment, a switch (not shown) may be arranged in parallel with capacitive element 188. Thus, when the switch across capacitive element 188 is closed, an effective capacitance at capacitive element 188 will be infinite, thus producing circuit capacitance 154 of zero.

FIG. 9 shows a table 202 of exemplary capacitor values for the multiple capacitive elements 180, 182, 184, 186, and 188 within capacitive circuits 150 (FIG. 6) and the resulting effective network capacitances. Each row 204 of table 202 provides values for each of capacitive elements 180, 182, 184, 186, and 188 for one of capacitive circuits 150 to obtain a desired circuit capacitance 154. Circuit capacitance 154 for each of capacitive circuits 150 is shown in a column 206 of table 202 when an associated one of switch elements 164 (FIG. 6) is open, i.e., capacitive circuit 150 is "ON." For illustrative purposes, each row 204 of table 202 also shows that regardless of the values for each of capacitive elements 180, 182, 184, 186, and 188, when an associated one of switch elements 164 is closed, i.e., capacitive circuit 150 is "OFF," circuit capacitance will be zero, represented in a column 208.

It should be recalled that due to the parallel configuration of capacitive circuits 150, each of effective capacitances 132 and 134 (FIG. 4) can be determined by summing each of circuit capacitances 154, shown in column 206, for those capacitive circuits 150 that are "ON." In addition, the selected values for each of capacitive elements 180, 182, 184, 186, and 188 can result in capacitive circuits 150 having different circuit capacitances 154 with respect to one another. Accordingly, in this illustrative embodiment, the lowest effective capacitance 132 or 134 will be is 0 femtofarads and the highest effective capacitance 132 or 134 will be 51 femtofarads (all circuit capacitances 154 summed). Thus, capacitive networks 112 and 114 having values for capacitive elements 180, 182, 184, 186, and 188 in accordance with table 202 will yield a wide effective capacitance range (e.g., 0 to 51 femtofarads) with less than one femtofarad resolution (e.g., 0.2, 0.4, and 0.8 femtofarads).

Referring briefly to FIG. 7, it should be noted that it is desirable for a terminal impedance 210, labeled $Z_{11}$, at the input and a terminal impedance 212, labeled $Z_{22}$, at the output of capacitive circuit 150 to remain within an acceptable range as capacitive network 112 or 114 is switched. In other words, neither input 152 nor output 154 should be shorted nor show an excessively large equivalent capacitance, as this could interfere with system operation by excessively loading drive nodes 34 and 36 and/or sense nodes 42 and 44 (FIG. 4). In practice, excessive loading can create stability problems, can reduce signal levels below desirable levels, and/or can lead to other performance issues.

With reference back to FIG. 9, terminal impedance 210 (FIG. 7) has been converted to a terminal capacitance 214, labeled C11, and terminal impedance 212 (FIG. 7) has been converted to a terminal capacitance 216, labeled C22. A column 218 of values represents terminal capacitance 214 for each combination of capacitive elements 180, 182, 184, 186, and 188 that results in a desired circuit capacitance 154 when an associated one of switch elements 164 (FIG. 6) is open, i.e., capacitive circuit 150 is "ON." A column 220 of values represents terminal capacitance 214 when an associated one of switch elements 164 (FIG. 6) is closed, i.e., capacitive circuit 150 is "OFF." Likewise, a column 222 of values represents terminal capacitance 216 when an associated one of switch elements 164 (FIG. 6) is open, i.e., capacitive circuit 150 is "ON," and a column 224 of values represents terminal capacitance 216 when an associated one of switch elements 164 (FIG. 6) is closed, i.e., capacitive circuit 150 is "OFF."

Review of terminal capacitances 214 and 216 for each combination of capacitive elements 180, 182, 184, 186, and 188 reveals that there is little capacitance change between closed and open positions of switch element 164. Furthermore, terminal capacitances 214 and 216 are of similar magnitudes to the values of capacitive elements 180, 182, 184, 186, and 188 so that drive nodes 34 and 36 and/or sense nodes 42 and 44 are not excessively loaded.

In practice, a method for substantially cancelling parasitic currents 70 and 72 (FIG. 4) in a MEMS sensor 110 (FIG. 4) entails providing capacitor networks 112 and 114 between appropriate drive nodes 34 and 36 and sense nodes 42 and 44, as described in detail above. A determination can then be made of parasitic capacitance 22 between drive node 34 and sense node 42 having the same polarity, and likewise, parasitic capacitance 24 between drive node 36 and sense node 44. This determination can be made in conjunction with post-production testing and calibration of MEMS sensor 110. Each of capacitor networks 112 and 114 can then be separately adjusted via digital control to selectively include, i.e., activate or inactivate, particular capacitive circuits 150 (FIG. 6), as discussed above, to provide respective effective capacitances 132 and 136 (FIG. 4).

As such when drive voltage 56 (FIG. 4) is applied between drive nodes 34 and 36 to induce oscillatory linear motion 58 of moving drive fingers, drive voltage 58 will concurrently be applied to capacitor networks 112 and 114. The resulting correction current 134 (FIG. 4) through capacitor network 112 is substantially equivalent to, and opposite in phase to, parasitic current 70 (FIG. 4) and will thus cancel parasitic current 70 at sense node 42. Likewise, the resulting correction current 136 (FIG. 4) through capacitor network 114 is substantially equivalent to and out of phase with parasitic current 72, and will thus cancel parasitic current 72 at sense node 44. This cancelation of parasitic currents 70 and 72 greatly reduces parasitic-induced error 88 (FIG. 2) to yield a more accurate output voltage 68 (FIG. 4) representing the sensed angular velocity.

Embodiments of the invention are discussed in connection with two capacitive networks implemented in a differential sensor system. However, such a configuration is not a limitation. Rather, a single capacitive network, e.g., capacitive network 112 (FIG. 4), may be implemented in a single-ended sensor system. In such a configuration, an element, e.g., a resonator element, may have a single drive node and a single sense node between which parasitic current is present when a drive voltage from a voltage source is applied at the drive node. In an embodiment, input 116 of capacitive network 112 is coupled to another voltage source and output 120 of capacitive network is coupled to the single sense node. The voltage source may be used to apply another drive voltage of opposite phase to capacitive network 112 to produce correction current 134 that substantially cancels the parasitic current.

Embodiments of the invention entail microelectromechanical systems (MEMS) sensors, such as a gyroscope sensor, with reduced parasitic-induced error and methodology for reducing parasitic-induced error in a MEMS sensor. Two-port capacitive networks are implemented in the MEMS sensor that allow for adjustment of an effective capacitance in order to create opposing currents of the proper phase to cancel parasitic-induced error currents. The two-port capacitive networks are digitally adjustable over a wide range of capacitances and allow the effective capacitances to be made as small as needed (e.g., below the smallest on-chip components or parasitic capacitances). The cancelation of parasitic-induced currents yields improved accuracy of a MEMS sensor.

Although the preferred embodiments of the invention have been illustrated and described in detail, it will be readily apparent to those skilled in the art that various modifications may be made therein without departing from the spirit of the invention or from the scope of the appended claims.

What is claimed is:
1. A device comprising:
a sensor element having a first drive node and a first sense node, wherein a first parasitic current is present between said first drive node and said first sense node when a drive signal is applied at said first drive node; and
a capacitive network having a first input coupled to a voltage source and a first output coupled to said first sense node, said first capacitive network substantially canceling said first parasitic current when a second drive signal of opposite phase to said first drive signal is applied at said first input.

2. A device as claimed in claim 1 wherein:
said capacitive network is a first capacitive network;
said sensor element includes a second drive node and a second sense node, wherein a second parasitic current is present between said second drive node and said second sense node when said drive signal is applied between said first and second drive nodes;
said first input of said first capacitive network is coupled to said second drive node; and
said device further comprises a second capacitive network having a second input coupled to said first drive node and a second output coupled to said second sense node, said second capacitive network substantially canceling said second parasitic current.

3. A device as claimed in claim 2 wherein a first parasitic capacitance is present between said first drive node and said first sense node, a second parasitic capacitance is present between said second drive node and said second sense node, and:
said first capacitive network is a first adjustable network for providing a first effective capacitance that is substantially equivalent to said first parasitic capacitance; and
said second capacitive network is a second adjustable capacitive network for providing a second effective capacitance that is substantially equivalent to said second parasitic capacitance.

4. A device as claimed in claim 3 wherein said first parasitic capacitance differs from said second parasitic capacitance, and said first and second adjustable capacitive networks are separately tunable for obtaining said first and second effective capacitances.

5. A device as claimed in claim 2 wherein said sensor element comprises a movable structure adapted to oscillate in a first direction and a second direction perpendicular to said first direction, a first portion of said movable structure being spaced between said first and second drive nodes, and a second portion of said movable structure being spaced between said first and second sense nodes, wherein said drive signal applied at said first and second drive nodes oscillates said first portion of movable structure in said first direction and said first and second sense nodes detect motion of said second portion of said movable structure in said second direction occurring in response to oscillation of said first portion in said first direction, said motion in said second direction being responsive to a Coriolis force produced by rotation about an axis perpendicular to said first and second directions.

6. A device as claimed in claim 1 wherein said capacitive network is a two-port capacitive network.

7. A device as claimed in claim 1 wherein a parasitic capacitance is present between said first drive node and said first sense node, and said capacitive network comprises multiple capacitive circuits connected in parallel to produce an effective capacitance that is substantially equivalent to said parasitic capacitance.

8. A device as claimed in claim 7 wherein at least two of said capacitive circuits have different capacitances with respect to one another.

9. A device as claimed in claim 7 wherein at least one of said capacitive circuits has a capacitance that is no greater than said parasitic capacitance.

10. A device as claimed in claim 9 wherein said capacitance is less than one femtofarad.

11. A device as claimed in claim 7 wherein each of said capacitive circuits comprises:
   a first capacitive element;
   a second capacitive element;
   a third capacitive element, said first, second, and third capacitive elements being connected in series;
   a fourth capacitive element having a first end coupled between said first and second capacitive elements and a second end coupled to ground; and
   a fifth capacitive element having a third end coupled between said second and third capacitive elements and a fourth end coupled to said ground.

12. A device as claimed in claim 1 wherein:
   said capacitive network comprises multiple capacitive circuits connected in parallel to produce an effective capacitance; and
   said device further comprises:
      multiple control circuits, one each of said control circuits being coupled with one each of said capacitive circuits; and
      a digital control element coupled to said each of said control circuits to selectively include ones of said capacitive circuits to produce said effective capacitance.

13. A device as claimed in claim 12 wherein:
   each of said control circuits comprises a switch element interposed between said one each of said capacitive circuits and ground; and
   said digital control element comprises multiple logic gates, one each of said logic gates being associated with each said switch element, wherein said each of said logic gates provides a bit having one of a first state and a second state, said first state actuating a corresponding said switch element to provide a shunt to ground, and said second state de-actuating said corresponding said switch element to remove said shunt to ground.

14. A device as claimed in claim 13 wherein said switch element comprises a metal oxide semiconductor (MOS) transistor.

15. A method of substantially cancelling parasitic current in a device, said device including a sensor element having a first drive node, a second drive node, a first sense node, and a second sense node, a first capacitive network having a first input coupled to said second drive node and a first output coupled to said first sense node, a second capacitive network having a second input coupled to said first drive node and a second output coupled to said second sense node, and said method comprising:
   adjusting said first capacitive network to provide a first effective capacitance that is substantially equivalent to a first determined parasitic capacitance between said first drive node and said first sense node, said first parasitic capacitance causing a first parasitic current upon application of a drive signal to said sensor element;
   adjusting said second capacitive network to provide a second effective capacitance that is substantially equivalent to a second determined parasitic capacitance between said second drive node and said second sense node, said second parasitic capacitance causing a second parasitic current upon application of said drive signal to said sensor element; and
   applying said drive signal at said first and second drive nodes to drive said sensor element, said drive signal concurrently being applied to said first and second capacitive networks to form a first correction current through said first capacitive network that is substantially equivalent and opposite in phase to said first parasitic current and to form a second correction current through said second capacitive network that is substantially equivalent and opposite in phase to said second parasitic current such that said first and second parasitic currents are substantially cancelled.

16. A method as claimed in claim 15 wherein prior to said adjusting said first and second capacitive networks, said method further comprises:
   determining said first parasitic capacitance between said first drive node and said first sense node; and
   determining said second parasitic capacitance between said second drive node and said second sense node.

17. A method as claimed in claim 15 wherein said first parasitic capacitance differs from said second parasitic capacitance, and said first and second capacitive networks are separately adjustable for obtaining said first and second effective capacitances that differ from one another.

18. A method as claimed in claim 15 wherein:
   said first capacitive network includes multiple first capacitive circuits connected in parallel to produce said first effective capacitance;
   said second capacitive network includes multiple second capacitive circuits connected in parallel to produce said second effective capacitance;
   said adjusting said first capacitive network comprises utilizing digital control to selectively include ones of said first capacitive circuits to produce said first effective capacitance; and
   said adjusting said second capacitive network comprises utilizing said digital control to selectively include ones of said second capacitive circuits to produce said second effective capacitance.

19. A device comprising:
   a resonator element having a first drive node, a second drive node, a first sense node, and a second sense node, wherein a first parasitic capacitance is present between said first drive node and said first sense node to produce a first parasitic current, a second parasitic capacitance is present between said second drive node and said second sense node to produce a second parasitic current between said second drive node and said second sense node, said first and second parasitic currents being present when a drive signal is applied between said first and second drive nodes;
   a first capacitive network including multiple first capacitive circuits connected in parallel to produce a first effective capacitance that is substantially equivalent to said first parasitic capacitance, said first capacitive network having a first input connected to said second drive node and having a first output connected to said first sense node, said first capacitive network forming a first correction current when said drive signal is applied between said first and second drive nodes that is substantially equivalent and opposite in phase to said first parasitic current to substantially cancel said first parasitic current; and
   a second capacitive network including multiple second capacitive circuits connected in parallel to produce a second effective capacitance that is substantially equivalent to said second parasitic capacitance, said second capacitive network having a second input connected to said first drive node and a second output connected to said second sense node, said second capacitive network forming a second correction current when said drive signal is applied between said first and second drive nodes that is substantially equivalent and opposite in phase to said second parasitic current to substantially cancel said second parasitic current.

20. A device as claimed in claim 19 further comprising:

multiple first control circuits, one each of said first control circuits being coupled with one each of said first capacitive circuits;

a first digital control element coupled to said each of said first control circuits to selectively include ones of said first capacitive circuits to produce said first effective capacitance;

multiple second control circuits, one each of said second control circuits being coupled with one each of said second capacitive circuits; and a second digital control element coupled to said each of said second control circuits to selectively include ones of said second capacitive circuits to produce said second effective capacitance.

* * * * *